United States Patent [19]

Turner et al.

[11] Patent Number: 5,177,025
[45] Date of Patent: Jan. 5, 1993

[54] METHOD OF FABRICATING AN ULTRA-THIN ACTIVE REGION FOR HIGH SPEED SEMICONDUCTOR DEVICES

[75] Inventors: John E. Turner, Woodside; Theodore I. Kamins, Palo Alto; Martin P. Scott, San Francisco; Yvonne H. Keller, San Jose, all of Calif.

[73] Assignee: Hewlett-Packard Company, Palo Alto, Calif.

[21] Appl. No.: 825,524

[22] Filed: Jan. 24, 1992

[51] Int. Cl.⁵ .......................................... H01L 21/328
[52] U.S. Cl. ...................................... 437/31; 437/95; 437/131; 148/DIG. 41
[58] Field of Search ............... 437/131, 31, 95, 81; 148/DIG. 41

[56] References Cited

U.S. PATENT DOCUMENTS

| | | | |
|---|---|---|---|
| 4,835,112 | 5/1989 | Pfeister et al. | 437/24 |
| 4,983,536 | 1/1991 | Bulat et al. | 437/40 |
| 4,997,776 | 3/1991 | Harame et al. | 437/31 |
| 5,008,207 | 4/1991 | Blouse et al. | 437/31 |

FOREIGN PATENT DOCUMENTS

| | | | |
|---|---|---|---|
| 2-83932 | 3/1990 | Japan | 437/131 |
| 2-219234 | 8/1990 | Japan | 437/131 |

OTHER PUBLICATIONS

Ghandhi, S. K., VLSI Fabrication Principles, 1983, John Wiley & Sons, pp. 233–234.

C. A. King et al., "Si/Si$_{1-x}$Ge$_x$ Heterojunction Bipolar Transistors Produced by Limited Reaction Processing," *IEEE Electron Device Letters*, vol. 10, No. 2, Feb. 1989, pp. 52–54.

T. I. Kamins et al., "High Frequency Si/Si$_{1-x}$Ge$_x$ Heterojunction Bipolar Transistors," *Technical Digest of the 1989 International Electron Devices Meeting*, Dec. 1989, pp. 647–650.

Theodore I. Kamins et al., "Small-Geometry, High-Performance, Si-Si$_{1-x}$Ge$_x$ Heterojunction Bipolar Transistors," *IEEE Electron Device Letters*, vol. 10, No. 11, Nov. 1989, pp. 503–505.

Gary L. Patton et al., "Graded-SiGe-Base, Poly-Emitter Heterojunction Bipolar Transistors," *IEEE Electron Device Letters*, vol. 10, No. 12, Dec. 1989, pp. 534–536.

Gary L. Patton et al., "75-GHz f$_T$ SiGe-Base Heterojunction Bipolar Transistors," *IEEE Electron Device Letters*, vol. 11, No. 4, Apr. 1990, pp. 171–173.

"Heterojunction Bipolar Transistor Using Si Alloyed . . .," IBM Tech. Disc. Bull., vol. 33, No. 5, Oct. 1990, pp. 211–213.

*Primary Examiner*—T. N. Quach

[57] ABSTRACT

A method of fabricating a semiconductor device to retard diffusion of a dopant from a center active region into adjacent regions. The center active region is epitaxially formed by selectively increasing and decreasing an introduction of diffusion-suppressing material, preferably germanium, into a semiconductor material, preferably silicon, so that a vertical profile of the content of the diffusion-suppressing material is such that outdiffusion of a dopant is minimized. One embodiment of the tailoring is to increase the concentration of the diffusion-suppressing material at both of the opposed sides of a base region of a bipolar transistor, thereby providing concentration peaks at the interfaces of the base region with collector and emitter regions. The concentration of germanium in a Si$_{1-x}$Ge$_x$ layer is such that the value x is within the range 0.08 to 0.35 and optimally within the range 0.15 to 0.31. The dopant, preferably boron, also has a tailored concentration profile to minimize outdiffusion. A thinner, more highly doped active region is thereby achieved.

18 Claims, 5 Drawing Sheets

METHOD OF FABRICATING AN ULTRA-THIN ACTIVE REGION FOR HIGH SPEED SEMICONDUCTOR DEVICES

TECHNICAL FIELD

The present invention relates generally to the fabrication of semiconductor devices and more particularly to fabrication steps to retard diffusion of a dopant.

BACKGROUND ART

The transit time of carriers through an active region is an important consideration in maximizing the speed of a semiconductor device. For example, reducing the transit time through the base region of a bipolar transistor will lead to a higher speed transistor.

Extensive work has been performed within International Business Machines Corp. to minimize base transit time by accelerating carriers through the base region of an NPN transistor. U.S. Pat. No. 4,997,776 to Harame et al. teaches base and collector regions that are epitaxially formed silicon-germanium layers. An impurity profile plot illustrates a suggested grading of germanium content designed to create a drift field to accelerate carriers through a base region. The patent teaches that especially in NPN transistor performance, carriers are accelerated through the base region due to a smaller bandgap created by the grading of germanium. While the smaller bandgap in the base region reduces the barrier for electron injection into that region, the primary benefit is gained by bandgap grading which introduces a drift field, e.g., 15-25 kV/cm, aiding the transport of electrons. Patton et al., *IEEE Electron Device Letters*, vol. 10 (1989), pages 534-536, report use of a graded $Si_{1-x}Ge_x$ base material, with x varying from 0 to 0.14 to introduce the drift field that aids the transport of electrons. In *IEEE Electron Device Letters*, vol. 11 (April, 1990), pages 171-173, Patton et al. report a germanium grading in the base region of a heterojunction bipolar transistor (HBT) to create a drift field of approximately 20 kV/cm, resulting in an intrinsic transit time of only 1.9 ps.

While the research at International Business Machines Corp. has shown some of the advantages of $Si_{1-x}Ge_x$ in bipolar device design, there are limits to the improvement. Fabrication steps that occur subsequent to the epitaxial formation of the $Si_{1-x}Ge_x$ base region may adversely affect both the speed and the performance of the HBT. The transistors are particularly susceptible to degradation during subsequent steps which take place at elevated temperatures.

Silicon-germanium heterojunction bipolar transistors have been fabricated by others with concentrations of germanium that exceed those described above. Kamins et al., *IEEE Electron Device Letters*, vol. 10 (November, 1989), pages 503-505, describe the base region of an HBT with a uniform germanium content of 31 percent. Favorable results were obtained, but the report concludes that further improvement was likely available.

It is an object of the present invention to provide a method for fabricating a high-speed, high-performance semiconductor device.

SUMMARY OF THE INVENTION

The above object has been met by a method which takes the approach of minimizing dopant diffusion from an active region so that thinner active regions can be obtained, thereby requiring carriers to travel a shorter distance in traversing the active region. The active region is epitaxially formed and the concentration of a diffusion-suppressing material within the active region is tailored to provide a concentration distribution intended to minimize diffusion. That is, the focus is upon tailoring concentrations to reduce diffusion, rather than upon grading a material within a doped layer to create a drift field to aid the transport of electrons. Epitaxial formation allows tailoring of the concentration profiles of both the diffusion-suppressing material and a dopant within an active region fabricated according to the present invention.

While the present invention may be used in fabricating other types of semiconductor devices, in a preferred embodiment the active region is an epitaxial base layer of a bipolar transistor. Diffusion of boron within the epitaxial base layer is retarded by tailoring the concentration of germanium within a silicon germanium alloy. Preferably, the concentration of germanium is maintained within the range of 8 percent to 35 percent, with an optimal range being 15 percent to 31 percent The higher concentrations retard diffusion, but too great a concentration will cause structural instability of the epitaxial base layer.

As noted above, the approach to increasing the speed of the semiconductor device is to reduce the width of the active region. It is known that the width of a base region of a bipolar transistor affects the speed of the transistor. However, conflicting requirements of bipolar transistors limit the speed and performance of such transistors. On the one hand, a thinner base region leads to a shorter transit time. On the other hand, the thinner base region will adversely increase the base resistance unless the doping concentration is increased. However, a higher concentration of dopant, such as boron, causes accelerated dopant diffusion (concentration enhanced diffusivity) from the base region during subsequent fabrication steps that require an elevated temperature.

Consequently, retarding boron diffusion is an important limiting factor in the fabrication of ultra-fast bipolar transistors and other semiconductor devices. The present invention utilizes germanium as a diffusion-suppressing material and tailors the concentration of the germanium in a manner to allow fabrication of thin, highly doped base regions. In the preferred embodiment, the tailoring is such that the diffusion retarding distribution of germanium is located near the boundaries between emitter, base and collector regions. However, this preferred tailoring is not critical to the present invention. Simultaneously, the base dopant, e.g., boron, may also be tailored to provide an absence of base dopant near the interfaces with the emitter and collector regions. This tailoring of the base dopant further ensures that outdiffusion from the base region is reduced or eliminated.

An advantage of the present invention is that the intentional incorporation and tailoring of germanium to reduce boron diffusivity allows the fabrication of significantly faster bipolar devices and other improved semiconductor devices, such as shallow junction MOS devices. Current procedures for minimizing the width of a base region rely upon low epitaxial growth temperatures and low temperature steps in processing subsequent to the epitaxial growth. The present invention allows some relaxation of the restrictive use of low temperature processing steps. U.S. Pat. No. 4,835,112 to Pfiester et al. teaches that germanium may be implanted to retard diffusion of dopants which have also been implanted. However, the implantation allows neither a tailoring of the concentration of germanium to minimize base width nor tailoring of the boron. Moreover, the implantation of germanium at sufficient levels will cause damage to the lattice of the semiconductor layer. Such damage can only be removed by elevated temperatures.

Another advantage is that in addition to retarding outdiffusion from the active region, the present invention suppresses diffusion within the active region, so that the resulting active region is one that is less susceptible to a redistribution of dopant that was originally introduced in a manner to achieve a desired concentration profile of dopant. Yet another advantage is that while the primary focus is upon retarding diffusion by tailoring the diffusion-suppressing germanium, the germanium within the epitaxial region provides a drift field that aids the transport of electrons.

In one embodiment, a collector region of silicon having an n-type dopant is grown on a silicon substrate using a chemical vapor deposition reactor. A layer of $Si_{1-x}Ge_x$ epitaxial material is then grown at 500° C. to 700° C. within the reactor. Both the germanium and the boron that dopes the layer have tailored concentrations as described above. An n-type emitter region of silicon is then grown at a temperature within the range 500° C. to 750° C.

BEST MODE FOR CARRYING OUT THE INVENTION

Figure 1:
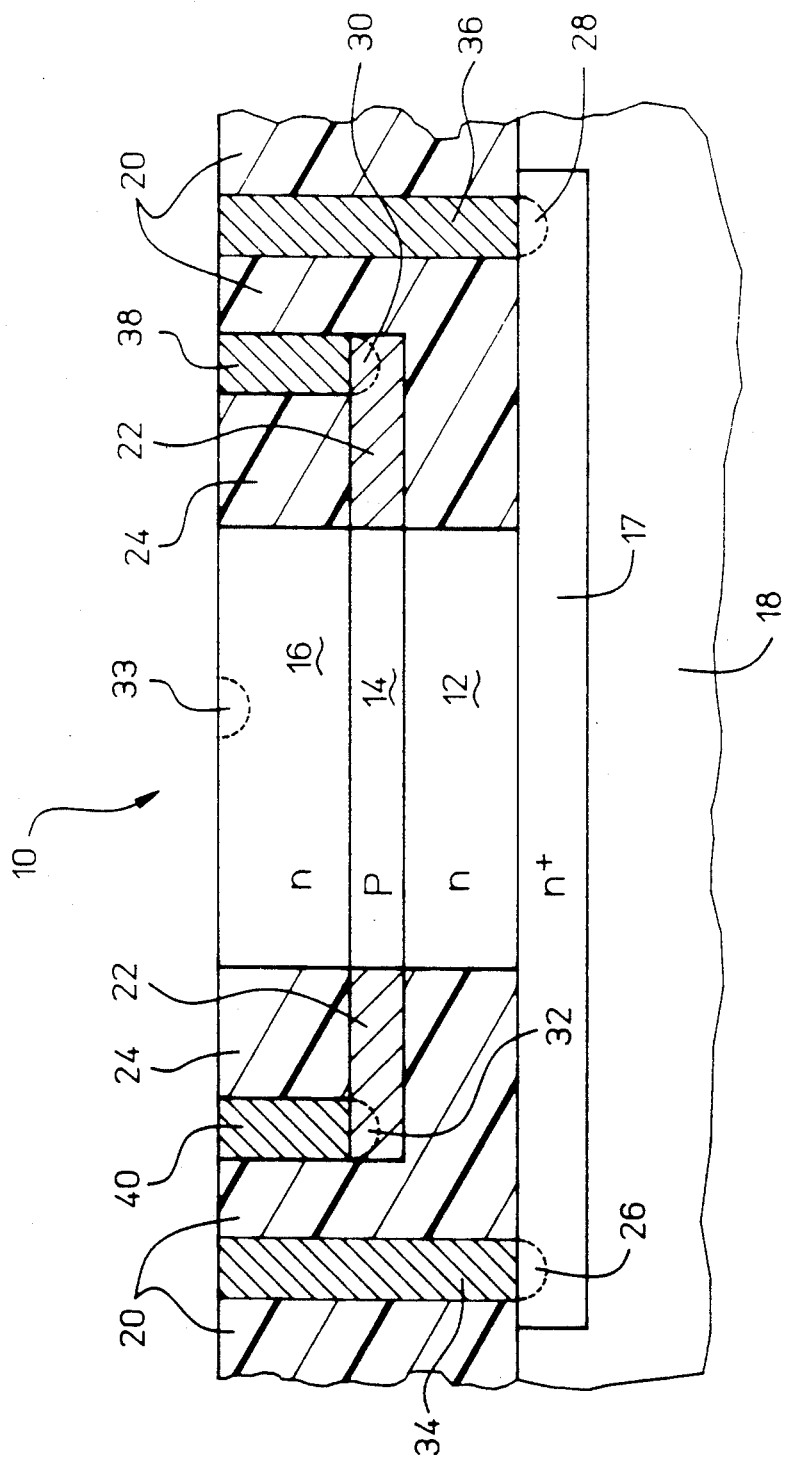
FIG. 1 is a side sectional view of a heterojunction bipolar transistor fabricated in accord with the present invention.

With reference to FIG. 1, a heterojunction bipolar transistor 10 is shown as including three epitaxially grown active regions, comprising a collector region 12, a base region 14 and an emitter region 16. The epitaxial layers that form the active regions 12–16 are grown on an n+ buried layer or subcollector region 17 of a silicon substrate 18. These epitaxial layers may be deposited by any of a number of different techniques. Some of these techniques are types of chemical vapor deposition (CVD). The discussion below gives typical parameters for silicon and silicon germanium in situ deposition in a lamp-heated CVD system. This process is known to provide abrupt transitions in doping concentration. Different deposition parameters would be used in other types of CVD systems.

An isolation structure 20 of silicon dioxide is deposited at 400° C. and is patterned to provide a region for formation of the heterojunction bipolar transistor 10. A layer of polysilicon 22 to be used for electrical connection to the base region 14 may be formed either prior to or subsequent to deposition of the epitaxial active regions 12–16. The silicon dioxide that comprises the isolation structure 20 is formed and patterned using conventional semiconductor fabrication process steps.

Prior to growth of the collector region 12, the silicon substrate 18 receives a suitable pretreatment to clean the surface. The collector region 12 is grown at a temperature within the range of 750° C. to 1100° C. within an atmosphere of $SiCl_2H_2$ and $AsH_3$ in an $H_2$ carrier gas to form an arsenic-doped silicon layer. A typical doping level may be $3 \times 10^{16}$ atoms/cm$^3$.

Figure 2:
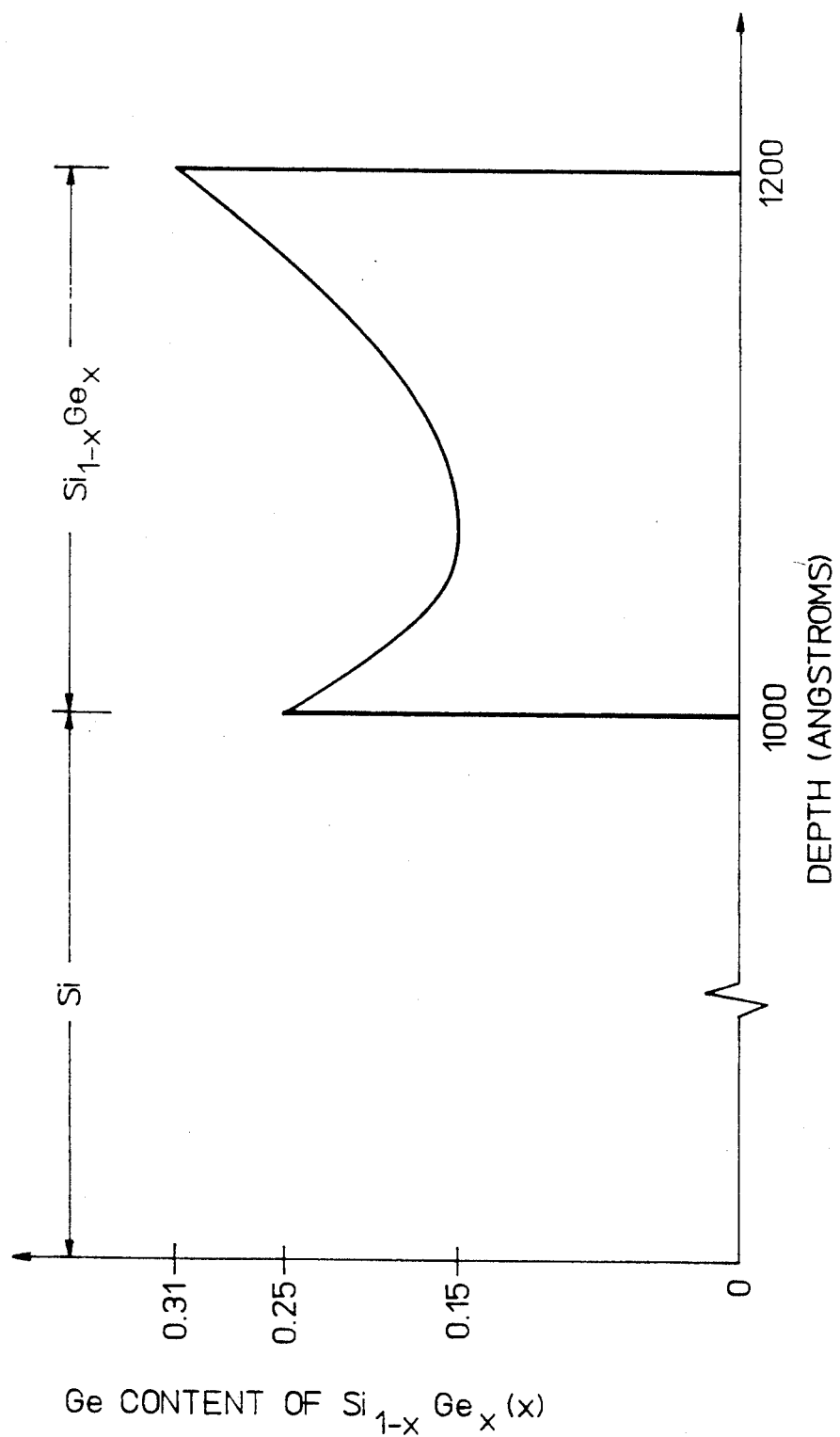
FIG. 2 is a graphical view of a tailored concentration profile of germanium in a $Si_{1-x}Ge_x$ base region of FIG. 1.

The base region 14 is a layer of $Si_{1-x}Ge_x$. As will be described more fully below, the value x is varied along the vertical profile of the base region 14. That is, the concentration of germanium is tailored. One embodiment of the tailoring is shown in FIG. 2. The tailoring is designed to retard the diffusion of boron within the base region 14 and from this region into adjacent regions. The $Si_{1-x}Ge_x$ is grown in the range of 500° C. to 700° C. using $GeH_4$, $SiCl_2H_2$ and $B_2H_6$.

The emitter layer 16 is grown in a similar manner as the collector region 12. However, the temperature at which the emitter region is grown is more important than the growing of the collector region, since high temperatures induce boron diffusion within the base region 14. Because of the tailoring of the germanium within the base region, the diffusion is less likely to adversely affect the electrical performance of the resulting structure. While the restrictive use of low temperature processing steps is relaxed compared to prior art methods, diffusion is still a concern. The growth of the silicon emitter region 16 should be at a temperature as low as practical limitations allow. There are limited gains with respect to minimizing diffusivity below 700° C.

Following deposition of the epitaxial active regions 12–16, the transistor structure is completed using generally conventional silicon processing. If the polysilicon layer 22 that provides the external base connection to the base region 14 has not previously been formed, the polysilicon is deposited and an isolation layer 24 of silicon dioxide is provided as an insulator. Then, contact regions are opened to the base-connection polysilicon layer 22 and the subcollector region 17. The contact openings are laterally displaced from the active transistor 10. While not shown, a contact to the emitter region 16 is preferably formed directly over the active transistor 10. The contact regions 26, 28, 30, 32 and 33 may be further doped by ion implantation of suitable species, e.g., boron for the base region 14 and arsenic or phosphorus for the subcollector region 17 and the emitter region 16, followed by annealing at a moderate temperature to activate the dopant atoms. Ohmic metal contacts 34, 36, 38 and 40 may then be formed on the heavily doped contact regions 26–33. The ohmic metal contacts typically comprise a barrier layer of titanium-tungsten and an upper layer of an aluminum alloy, such as aluminum-copper. A final low-temperature anneal at approximately 400° C.–450° C. completes the device-fabrication process.

Referring now to FIG. 2, a tailored vertical profile of the germanium concentration in the $Si_{1-x}Ge_x$ base region 14 is shown. It has been discovered that the germanium acts as a diffusion-suppressing material in a heterojunction bipolar transistor. The concentration of germanium has been tailored to minimize outdiffusion of boron at the interfaces of the base region with the silicon collector and emitter regions 12 and 16 and to retard diffusion internal to the base region. The concentration at the base-collector interface is greater than the concentration at the base-emitter interface, thereby enhancing the drift field effect of the silicon-germanium at the base-collector interface. Thus, there are benefits during both the fabrication and the operation of the heterojunction bipolar transistor.

Figure 3:
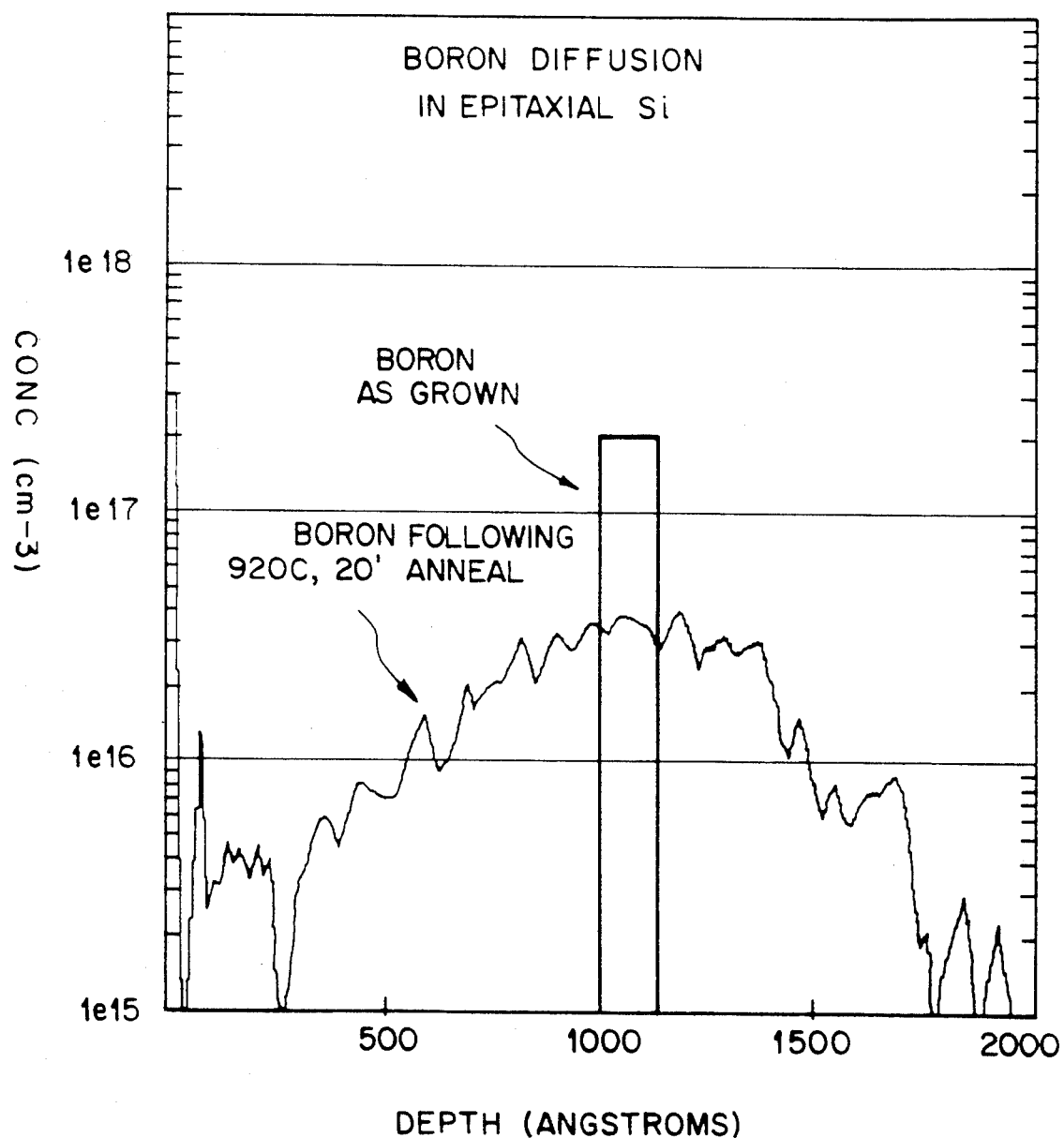
FIG. 3 illustrates graphically the diffusion of boron in an epitaxial silicon layer after a 20 minute anneal at 920° C.
Figure 4:
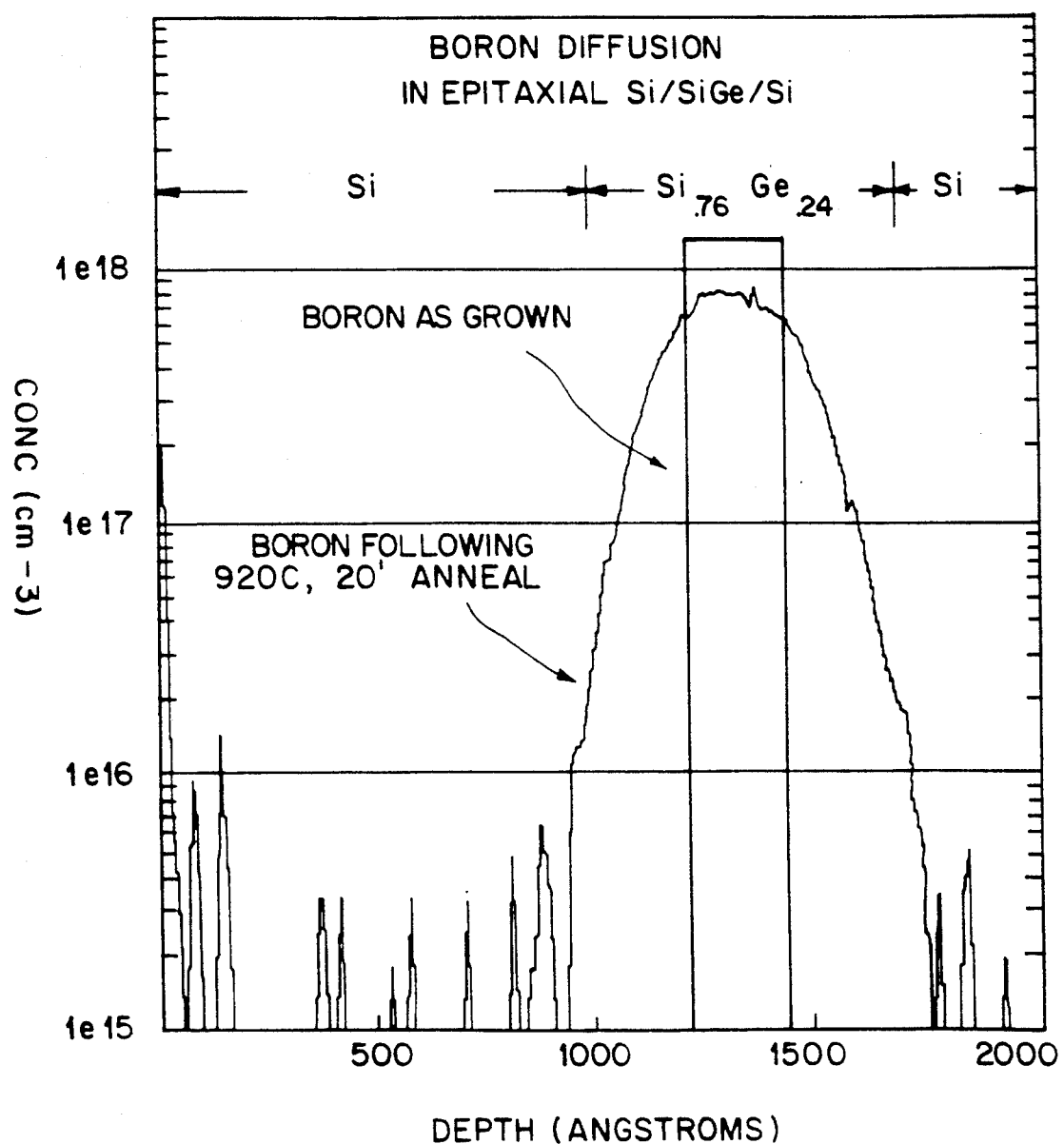
FIG. 4 illustrates graphically the diffusion of boron in an epitaxial layer of $Si_{0.76}Ge_{0.24}$ after a 20 minute anneal at 920° C.

FIGS. 3 and 4 illustrate the effect of germanium on the diffusion of boron. FIG. 3 is a graphical illustration of diffusion in epitaxial silicon. After the epitaxial silicon has been subjected to an anneal of 20 minutes at a temperature of 920° C., the boron is diffused significantly throughout the epitaxial silicon. The boron diffusivity is estimated at $3 \times 10^{-15}$ cm$^2$/second. In comparison, FIG. 4 illustrates diffusion in an epitaxial layer of $Si_{1-x}Ge_x$, with $x=0.24$. After a 20 minute anneal at a temperature of 920° C., the boron distribution remains closer to the original distribution and outdiffusion is greatly reduced. Boron diffusivity in $Si_{0.76}Ge_{0.24}$ for a 920° C. anneal is estimated at $3 \times 10^{-16}$ cm$^2$/second. The boron diffusivity may be further reduced by tailoring the vertical profile of germanium content as described above. Moreover, FIG. 4 shows a tailoring of the boron which leaves an absence of boron at the opposed sides of the $Si_{1-x}Ge_x$ layer. Typically, the boron-free areas within the $Si_{1-x}Ge_x$ layer are thinner. The boron-free areas further ensure that outdiffusion does not adversely affect transistor performance.

Figure 5:
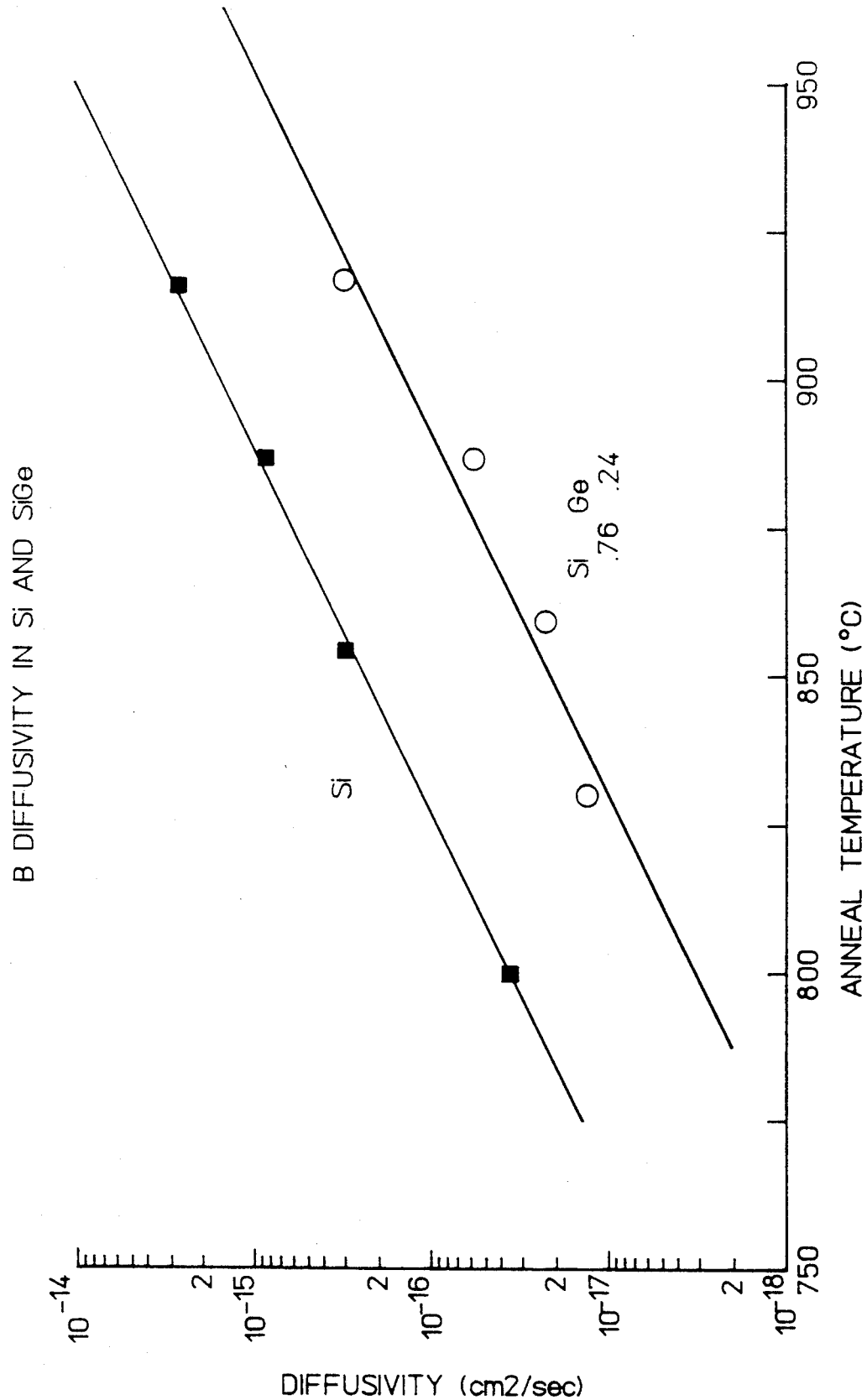
FIG. 5 illustrates graphically the difference of diffusivity of boron in silicon and in $Si_{0.76}Ge_{0.24}$.

FIG. 5 shows measured boron diffusivity in silicon and in $Si_{0.76}Ge_{0.24}$ for temperatures ranging from 800° C. to 920° C.. The boron diffusivity in the $Si_{0.76}Ge_{0.24}$ is approximately 15 percent of the boron diffusivity in Si at any temperature within this range. Correspondingly, there is an immediate gain of 75° C. in the available thermal budget, if $Si_{1-x}Ge_x$ is used to retard the boron diffusion.

FIG. 5 shows that the inclusion of Ge reduces the boron diffusivity. While it is not fully understood why the addition of germanium suppresses boron diffusion, there are a number of possible explanations. A first explanation involves the difference between the intrinsic carrier concentration of Si and that of $Si_{1-x}Ge_x$. In some ranges of dopant concentrations, the diffusion might be extrinsic for Si and intrinsic for $Si_{1-x}Ge_x$. Thus, a concentration-enhanced diffusivity might be observed for Si and a lower intrinsic diffusivity might be found for $Si_{1-x}Ge_x$ for the same boron doping concentration. Other explanations relate to the physical mechanisms of dopants moving through a lattice. The two dominant diffusion mechanisms are (1) substitutional diffusion in which dopant atoms propagate through the lattice by replacing an atom of the semiconductor material at a given lattice site and (2) interstitial diffusion in which dopant atoms do not diffuse by replacing the semiconductor atoms at the lattice, but instead move throughout the interstitial voids in the three-dimensional lattice structure. Research suggests that germanium may somehow suppress the interstitial diffusion mechanism and, hence, the overall diffusivity.

While the present invention has been described and illustrated as a method of fabricating a heterojunction bipolar transistor, the method may be used to fabricate other devices, such as shallow junction MOS transistors, and may be used to fabricate optical-electronic devices or other devices in which performance can be enhanced by retarding diffusion of atoms during fabrication. Depending upon the precise mechanism, suppression of diffusion of dopants other than boron may be achieved. Inhibition of diffusion of an n-type dopant, such as arsenic or phosphorus, in $Si_{1-x}Ge_x$ is also possible because the diffusion mechanisms of n-type dopants are similar to those for p-type dopants. Moreover, the use of germanium as the diffusion-suppressing material is considered to be the preferred material for reasons involving both experimental results and ease of fabrication, but other alloys may be used. For example, the $Si_{1-x}Ge_x$ may be replaced by $Si_{1-y}C_y$ or by $Si_{1-x-y}Ge_xC_y$.

We claim:

1. A method of fabricating a doped region of a semiconductor device to retard diffusion of a dopant into regions adjacent to said doped region, said method comprising, forming an epitaxial first layer adjacent to a monocrystalline semiconductor second layer, said step of forming including epitaxially incorporating both a dopant and a diffusion-suppressing material in a semiconductor material, said epitaxial incorporation of said diffusion-suppressing material including tailoring the concentration of said diffusion-suppressing material within said epitaxial first layer so that diffusion of said dopant into said semiconductor second layer is minimized, said semiconductor second layer being substantially absent of said diffusion-suppressing material, whereby said step of tailoring the concentration of said diffusion-suppressing material minimizes dopant outdiffusion from said epitaxial first layer and retards dopant diffusion within said epitaxial first layer.

2. The method of claim 1 further comprising forming a semiconductor third layer on a side of said epitaxial first layer opposite to said semiconductor second layer, said tailoring the concentration of said diffusion-suppressing material including varying said incorporating said diffusion-suppressing material during said step of forming said epitaxial first layer such that diffusion of said dopant is less at interfaces of said epitaxial first layer with said semiconductor second and third layers than is diffusion within a central region of said epitaxial first layer.

3. The method of claim 2 wherein said tailoring increases said concentration of said diffusion-suppressing material with approach to said interfaces.

4. The method of claim 2 wherein said step of forming said epitaxial first layer includes selecting germanium as said diffusion-suppressing material and includes selecting silicon as said semiconductor material.

5. The method of claim 1 wherein said step of forming said epitaxial first layer includes tailoring said concentration of said dopant so that the area of said epitaxial first layer adjacent to said semiconductor second layer is substantially free of said dopant.

6. The method of claim 2 wherein said semiconductor second and third layers are selected to be silicon layers and wherein said step of forming said epitaxial first layer is a step of selecting germanium as said diffusion-suppressing material, thereby forming a layer of $Si_{1-x}Ge_x$, said tailoring of the concentration of germanium including varying the value x, but maintaining said value x within the range 0.08 to 0.35.

7. The method of claim 6 including maintaining said value x within the range 0.15 to 0.31.

8. A method of fabricating a semiconductor device to retard diffusion of a dopant within a center region between two regions comprising, forming an epitaxial alloy layer on a first silicon layer, said step of forming said epitaxial alloy layer including selectively adjusting epitaxial procedure variables during said forming such that said epitaxial alloy layer includes a concentration profile of germanium tailored to minimize diffusion, thereby providing an epitaxial alloy layer of $Si_{1-x}Ge_x$ wherein x is selectively varied through said epitaxial alloy layer, said adjusting of said epitaxial procedure variables including introducing said germanium throughout said step of forming said epitaxial alloy layer so that x remains above zero, said step of forming an epitaxial alloy layer further comprising introducing a dopant, and forming a second silicon layer on said epitaxial alloy layer, thereby providing a structure in which the center epitaxial alloy layer has a lower diffusivity with respect to said dopant than either of said first and second silicon layers.

9. The method of claim 8 wherein said introducing said dopant is an introducing of boron and wherein selectively adjusting epitaxial procedure variables is such that high concentrations of germanium are introduced at areas of said epitaxial alloy layer proximate to said first and second silicon layers and such that lower concentrations of germanium are introduced at areas proximate to a center of said epitaxial alloy layer.

10. The method of claim 9 wherein said introducing of boron is tailored such that areas of epitaxial alloy layer adjacent to said first and second silicon layers are substantially boron-free.

11. The method of claim 8 wherein selectively adjusting said epitaxial procedure variables includes maintaining x within the range 0.08 to 0.35.

12. The method of claim 8 wherein selectively adjusting said epitaxial procedure variables includes maintaining x within the range 0.15 to 0.31.

13. A method of fabricating a semiconductor device to retard diffusion of a dopant from a center region into adjacent regions comprising, forming a collector region having a first conductivity type, epitaxially forming a base region of an epitaxial alloy on said collector region, including selectively increasing and decreasing an introduction of a diffusion-suppressing material into a semiconductor material so that concentration of said diffusion-suppressing material is maximized at a first side contacting said collector region and at a second side opposite to said first side, said increasing and decreasing said introduction being carried out in a manner to provide a lesser concentration of said diffusion-suppressing material at areas between said first and second sides while maintaining said diffusion-suppressing material above zero percent by content, said base region having a second conductivity type, and epitaxially forming an emitter region of epitaxial material on said second side of said base region, said emitter region having said first conductivity type.

14. The method of claim 13 wherein said step of epitaxially forming said base region includes selecting germanium as said diffusion-suppressing material, selecting silicon as said semiconductor material, and selecting boron to dope said base region.

15. The method of claim 14 wherein said step of epitaxially forming said base region includes selectively increasing and decreasing an introduction of boron so that areas of said base region adjacent to said first and second sides are substantially without boron.

16. The method of claim 14 wherein said steps of forming said collector and emitter regions each includes selecting silicon and an n-type dopant.

17. The method of claim 13 wherein said introducing of said diffusion-suppressing material is increased monotonically with approach to said first and second sides.

18. The method of claim 13 wherein said steps of forming said collector and emitter regions are each performed without introducing said diffusion-suppressing material.

* * * * *